United States Patent
Huang et al.

(10) Patent No.: US 9,442,157 B2
(45) Date of Patent: Sep. 13, 2016

(54) CONTROLLER CAPABLE OF DETECTING INPUT POWER AND GENERATING A PROTECTION SIGNAL

(71) Applicant: Chipone Technology(Beijing) Co., Ltd., Beijing (CN)

(72) Inventors: Jun Hsiung Huang, Hsinchu (TW); Yu Wen Chang, Hsinchu (TW)

(73) Assignee: CHIPONE TECHNOLOGY (BEIJING) CO., LTD., Beijing (CN)

(*) Notice: Subject to any disclaimer, the term of this patent is extended or adjusted under 35 U.S.C. 154(b) by 343 days.

(21) Appl. No.: 14/097,861

(22) Filed: Dec. 5, 2013

(65) Prior Publication Data

US 2015/0160287 A1 Jun. 11, 2015

(51) Int. Cl.
*G01R 31/28* (2006.01)
*H02H 3/24* (2006.01)

(52) U.S. Cl.
CPC .......... *G01R 31/2836* (2013.01); *H02H 3/24* (2013.01)

(58) Field of Classification Search
CPC ........................... H02H 3/24; G01R 31/2836
USPC ........................................................ 324/537
See application file for complete search history.

(56) References Cited

U.S. PATENT DOCUMENTS

| 5,203,000 A | * | 4/1993 | Folkes | ............... G06F 1/24 327/143 |
| 2005/0213355 A1 | * | 9/2005 | Koike | ............... H02M 3/33523 363/21.16 |
| 2012/0188670 A1 | * | 7/2012 | Lee | ............... H02H 3/24 361/56 |
| 2013/0015830 A1 | * | 1/2013 | Zhang | ............... H02M 1/14 323/282 |

OTHER PUBLICATIONS

"LM555 Single Timer" Data Sheet, Fairchild Semiconductor, © 2002 Fairchild Semiconductor Corporation.*

* cited by examiner

*Primary Examiner* — Felicia Farrow
(74) *Attorney, Agent, or Firm* — Ming Chow; Sinorica, LLC

(57) ABSTRACT

A controller capable of detecting input power and generating a protection signal for a power converter, including: a high voltage start-up pin for connecting with an output terminal of an external start-up circuit; a sample-and-hold circuit for periodically sampling a voltage signal at the high voltage start-up pin to generate a detected signal; a brownout detector for generating a first power-fault signal according to the detected signal; an AC-off detector for generating a second power-fault signal according to the detected signal; and an OR gate having a first input end coupled with the first power-fault signal, a second input end coupled with the second power-fault signal, and an output end providing a third power-fault signal.

6 Claims, 4 Drawing Sheets

CONTROLLER CAPABLE OF DETECTING INPUT POWER AND GENERATING A PROTECTION SIGNAL

BACKGROUND OF THE INVENTION

1. Field of the Invention

The present invention relates to a controller for a power converter, especially to a controller capable of providing a protection signal for a load of a power converter in response to a failure of an AC power.

2. Description of the Related Art

In powering some television apparatuses or portable computers, a power converter is required to provide a power-fault signal along with a DC output voltage for the television apparatuses or portable computers. The power-fault signal is required to be active when a brownout—a drop in voltage—of an AC power occurs or when the AC power gets shut off. As the DC output voltage may still remain at an operable level for a while after the brownout occurs or the AC power gets shut off, if the power-fault signal is not active immediately, the television apparatuses or portable computers may get damaged or malfunction. Please refer to FIG. 1, which illustrates a prior art power converter providing a power-fault signal. As illustrated in FIG. 1, a prior art power converter, including a bridge rectifier 101, a power transmission circuit 102, diodes 103-104, a resistor 105, a diode 106, a capacitor 107, a PWM (pulse width modulation) controller 108, an NMOS transistor 109, a resistor 110, a feedback circuit 111, diodes 112-113, a capacitor 114, resistors 115-116, a shunt regulator 117, a photo coupler 118, a bipolar transistor 119, a resistor 120, and an X capacitor 121, provides an output voltage $V_O$ and a power-fault signal $V_{PFLT}$ for a load 130. The load 130 can be a television apparatus or a portable computer.

The bridge rectifier 101 is used to generate an input voltage $V_{IN}$ according to an AC power $V_{ac}$.

The power transmission circuit 102, including a transformer, a diode, and a capacitor (not shown in the figure), is used to transmit power from the input voltage $V_{IN}$ to a DC output voltage $V_O$ and provide a voltage $V_{AUX}$ from an auxiliary coil of the transformer under a control of the NMOS transistor 109.

The diodes 103-104 and the resistor 105 form a start-up circuit to provide power for the PWM controller 108 via a HV pin during an initial period after the AC power $V_{ac}$ is applied.

The diode 106 and the capacitor 107 generate a DC voltage $V_{CC}$ according to $V_{AUX}$. When the DC voltage $V_{CC}$ is built up, the current path of the start-up circuit will be switched off, and the PWM controller 108 will be solely powered by the DC voltage $V_{CC}$.

The PWM (pulse width modulation) controller 108 is powered by the DC voltage $V_{CC}$ to provide a gating signal $V_G$ in response to a current sensing signal $V_{CS}$ and a feedback signal $V_{FB}$.

The NMOS transistor 109 switches the power transmission circuit 102 in response to the gating signal $V_G$.

The resistor 110 generates the current sensing signal $V_{CS}$ according to a primary current $I_P$ flowing through a primary coil of the transformer when the NMOS transistor 109 is on.

The feedback circuit 111 generates the feedback signal $V_{FB}$ according to a difference of the DC output voltage $V_O$ and a reference voltage, the reference voltage being generated in the feedback circuit 111. When in operation, the DC output voltage $V_O$ will approach the reference voltage.

The diodes 112-113 and the capacitor 114 are used to generate a line voltage $V_{LINE}$ corresponding to the amplitude of the AC power $V_{ac}$.

The resistors 115-116 generate a control voltage $V_X$ corresponding to a ratio of the line voltage $V_{LINE}$.

The shunt regulator 117 has a control end connected with the control voltage $V_X$, a cathode connected to the photo coupler 118, and an anode connected to a first ground. When the control voltage $V_X$ is higher than a threshold voltage, the shunt regulator 117 will be turned on to pull down the voltage at the cathode to the first ground; and when the control voltage $V_X$ is below the threshold voltage, the shunt regulator 117 will be turned off.

The photo coupler 118 has a first terminal coupled to the DC voltage $V_{CC}$, a second terminal connected to the cathode, a third terminal coupled to the DC output voltage $V_O$, and a fourth terminal connected to a second ground. When the shunt regulator 117 is on, a current $I_{IN}$ will flow through the first terminal and the second terminal to turn on a channel between the third terminal and the fourth terminal.

The bipolar transistor 119 and the resistor 120 form an inverter to provide the power-fault signal $V_{PFLT}$.

The X capacitor 121 is used to suppress a differential interference accompanying the AC power $V_{ac}$.

When the control voltage $V_X$ is higher than the threshold voltage of the shunt regulator 117, the channel between the third terminal and the fourth terminal of the photo coupler 118 will be formed to generate a low voltage at the third terminal, and the power-fault signal $V_{PFLT}$ will be at a high level to indicate a normal status; and when the control voltage $V_X$ is lower than the threshold voltage of the shunt regulator 117, the channel between the third terminal and the fourth terminal of the photo coupler 118 will be off to generate a high voltage at the third terminal, and the power-fault signal $V_{PFLT}$ will be at a low level to indicate a power-fault status.

However, as the X capacitor 121 may still hold charges for as long as 2 seconds after the AC power $V_{ac}$ is switched off, the power-fault signal $V_{PFLT}$ may fail to be active well before the DC output voltage $V_O$ falls below a minimum operable level, and the load 130—a television apparatus or portable computer—can therefore get damaged or malfunction. Besides, as the generation of the power-fault signal $V_{PFLT}$ according to the design of FIG. 1 involves a separate circuit, which uses quite a few additional components and occupies an additional board area, the manufacturing cost will be increased substantially.

To solve the foregoing problem, a novel controller is needed.

SUMMARY OF THE INVENTION

One objective of the present invention is to disclose a controller capable of detecting input power and generating a protection signal for a power converter to alarm a television apparatus or a portable computer when a brownout of an AC power occurs.

Another objective of the present invention is to disclose a controller capable of detecting input power and generating a protection signal for a power converter to alarm a television apparatus or a portable computer shortly after an AC power gets shut off.

Another objective of the present invention is to disclose a controller capable of detecting input power using an existing start-up pin.

Still another objective of the present invention is to disclose a controller capable of detecting input power and generating a protection signal for a power converter to alarm a television apparatus or a portable computer using as few additional components as possible.

To attain the foregoing objectives, a controller capable of detecting input power and generating a protection signal for a power converter to alarm a load is proposed, including:

a high voltage start-up pin for connecting with an output terminal of an external start-up circuit, wherein the external start-up circuit has two input terminals coupled to an AC power;

a sample-and-hold circuit for periodically sampling a voltage signal at the high voltage start-up pin to generate a detected signal;

a brownout detector for generating a first power-fault signal according to the detected signal, wherein the first power-fault signal will be active when the detected signal is below a first threshold voltage for a first time duration, the first time duration being longer than half of a period of the AC power;

an AC-off detector for generating a second power-fault signal according to the detected signal, wherein the second power-fault signal will be active when the detected signal is above a second threshold voltage for a second time duration, the second time duration being longer than half of the period of the AC power; and an OR gate having a first input end coupled with the first power-fault signal, a second input end coupled with the second power-fault signal, and an output end providing a third power-fault signal.

To make it easier for our examiner to understand the objective of the invention, its structure, innovative features, and performance, we use preferred embodiments together with the accompanying drawings for the detailed description of the invention.

DETAILED DESCRIPTION OF THE PREFERRED EMBODIMENTS

The present invention will be described in more detail hereinafter with reference to the accompanying drawings that show the preferred embodiments of the invention.

Figure 2:
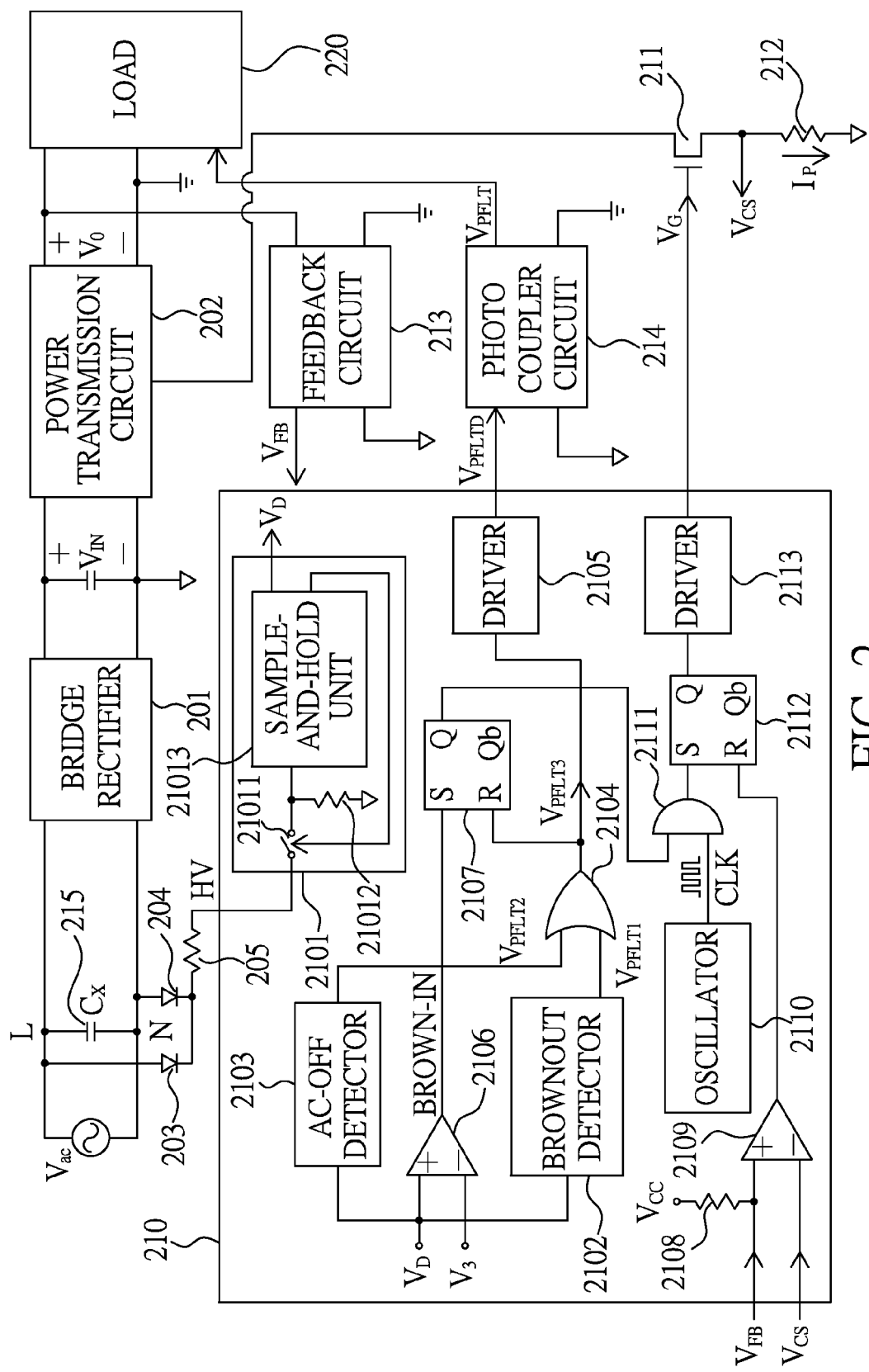
FIG. 2 illustrates a circuit diagram of a power converter using a controller of the present invention according to a preferred embodiment of the present invention.

Please refer to FIG. 2, which illustrates a circuit diagram of a power converter using a controller of the present invention according to a preferred embodiment of the present invention. As illustrated in FIG. 2, a power converter, including a bridge rectifier 201, a power transmission circuit 202, diodes 203-204, a resistor 205, a PWM controller 210, an NMOS transistor 211, a resistor 212, a feedback circuit 213, a photo coupler circuit 214, and an X capacitor 215, provides an output voltage $V_O$ and a power-fault signal $V_{PFLT}$ for a load 220. The load 220 can be a television apparatus or a portable computer.

The bridge rectifier 201 is used to generate an input voltage $V_{IN}$ according to an AC power $V_{ac}$.

The power transmission circuit 202, including at least a transformer, a diode, and a capacitor, is used to transmit power from the input voltage $V_{IN}$ to a DC output voltage $V_O$.

The diodes 203-204 and the resistor 205 form an external start-up circuit having two input terminals coupled to the AC power $V_{ac}$, and an output terminal connected with a high voltage start-up pin HV of the PWM controller 210. The diode 203 has an anode serving one terminal of the two input terminals and a cathode connected with a first end of the resistor 205. The diode 204 has an anode serving the other terminal of the two input terminals and a cathode connected with the first end of the resistor 205. The resistor 205 has a second end serving the output terminal.

The PWM controller 210, including a sample-and-hold circuit 2101, a brownout detector 2102, an AC-off detector 2103, an OR gate 2104, a driver 2105, a comparator 2106, a flip-flop 2107, a resistor 2108, a comparator 2109, an oscillator 2110, an AND gate 2111, a flip-flop 2112, and a driver 2113, provides a gating signal $V_G$ in response to a current sensing signal $V_{CS}$ and a feedback signal $V_{FB}$, and generates a power-fault driving signal $V_{PFLTD}$ according to a voltage signal at the high voltage start-up pin HV.

The sample-and-hold circuit 2101, which includes a switch 21011, a resistor 21012, and a sample-and-hold unit 21013, periodically samples a voltage signal at the high voltage start-up pin HV to generate a detected signal $V_D$, wherein the envelope of the detected signal $V_D$ is a ratio of the envelope of a full-wave rectified waveform of the AC power $V_{ac}$, and the ratio is determined by a voltage divider made up of the resistor 205 and the resistor 21012.

Figure 3:
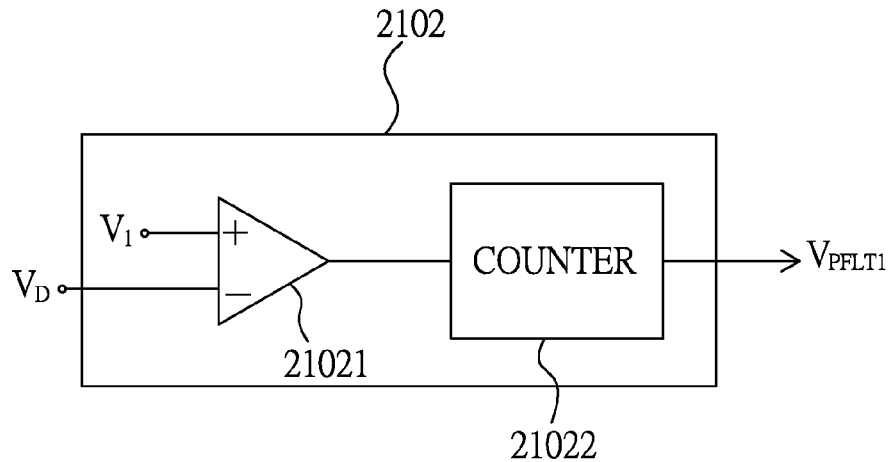
FIG. 3 illustrates a block diagram of an embodiment of a brownout detector in FIG. 2.

The brownout detector 2102 generates a first power-fault signal $V_{PFLT1}$ according to the detected signal $V_D$, wherein the first power-fault signal $V_{PFLT1}$ will be active when the detected signal $V_D$ is below a first threshold voltage for a first time duration, the first time duration being longer than half of a period of the AC power $V_{ac}$. Please refer to FIG. 3, which illustrates a block diagram of an embodiment of the brownout detector 2102. As illustrated in FIG. 3, the brownout detector 2102 includes a comparator 21021 and a counter 21022.

The comparator 21021 has a positive input end coupled with a first threshold voltage $V_1$, a negative input end coupled with the detected signal $V_D$, and an output end coupled to the counter 21022.

The counter 21022, which has an input end coupled with the output end of the comparator 21021, and an output end providing the first power-fault signal $V_{PFLT1}$, counts up when the output end of the comparator 21021 is at a high level, and is reset to an initial state—having a zero count, for example—when the output end of the comparator 21021 is at a low level. The first power-fault signal $V_{PFLT1}$ will be active (at a high level) when the counter 21022 counts up to a first predetermined number, which is corresponding to the first time duration.

Figure 4:
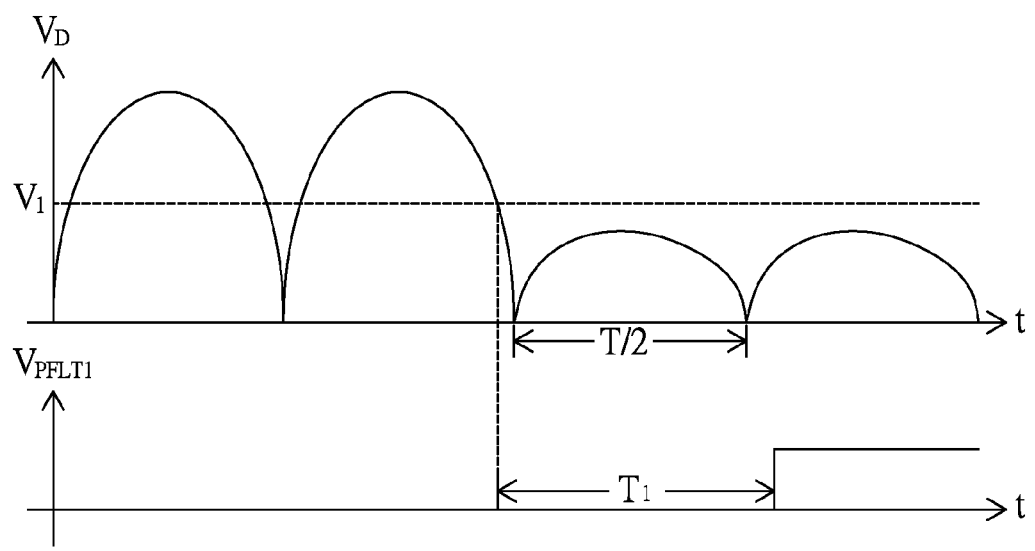
FIG. 4 illustrates corresponding waveforms of a detected signal $V_D$ and a first power-fault signal $V_{PFLT1}$ of FIG. 3.

FIG. 4 illustrates corresponding waveforms of the detected signal $V_D$ and the first power-fault signal $V_{PFLT1}$. As illustrated in FIG. 4, T/2 represents the half of a period of the AC power $V_{ac}$, $T_1$ represents the first time duration, and $T_1$ is longer than T/2.

Figure 5:
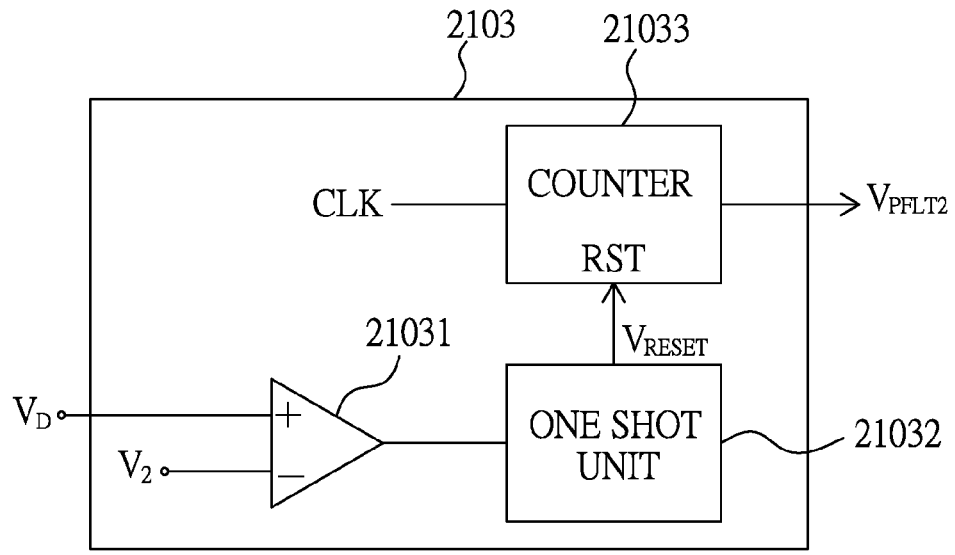
FIG. 5 illustrates a block diagram of an embodiment of an AC-off detector in FIG. 2.

The AC-off detector 2103 generates a second power-fault signal $V_{PFLT2}$ according to the detected signal $V_D$, wherein the second power-fault signal $V_{PFLT2}$ will be active when the detected signal $V_D$ is higher than a second threshold voltage for a second time duration, the second time duration being longer than half of a period of the AC power $V_{ac}$. Please refer to FIG. 5, which illustrates a block diagram of an embodiment of the AC-off detector 2103. As illustrated in FIG. 5, the AC-off detector 2103 includes a comparator 21031, a one shot unit 21032, and a counter 21033.

The comparator 21031 has a negative input end coupled with a second threshold voltage $V_2$, a positive input end coupled with the detected signal $V_D$, and an output end coupled to the one shot unit 21032.

The one shot unit 21032 has an input end coupled with the output end of the comparator 21031, and an output end providing a reset signal $V_{RESET}$ to the counter 21033.

The counter 21033, which has an input end coupled with a clock signal CLK, a reset end RST coupled with the reset signal $V_{RESET}$, and an output end providing the second power-fault signal $V_{PFLT2}$, counts up when the reset signal $V_{RESET}$ is at a low level, and is reset to an initial state—having a zero count, for example—when the reset signal $V_{RESET}$ is at a high level. The second power-fault signal $V_{PFLT2}$ will be active (at a high level) when the counter 21022 counts up to a second predetermined number, which is corresponding to the second time duration.

Figure 6:
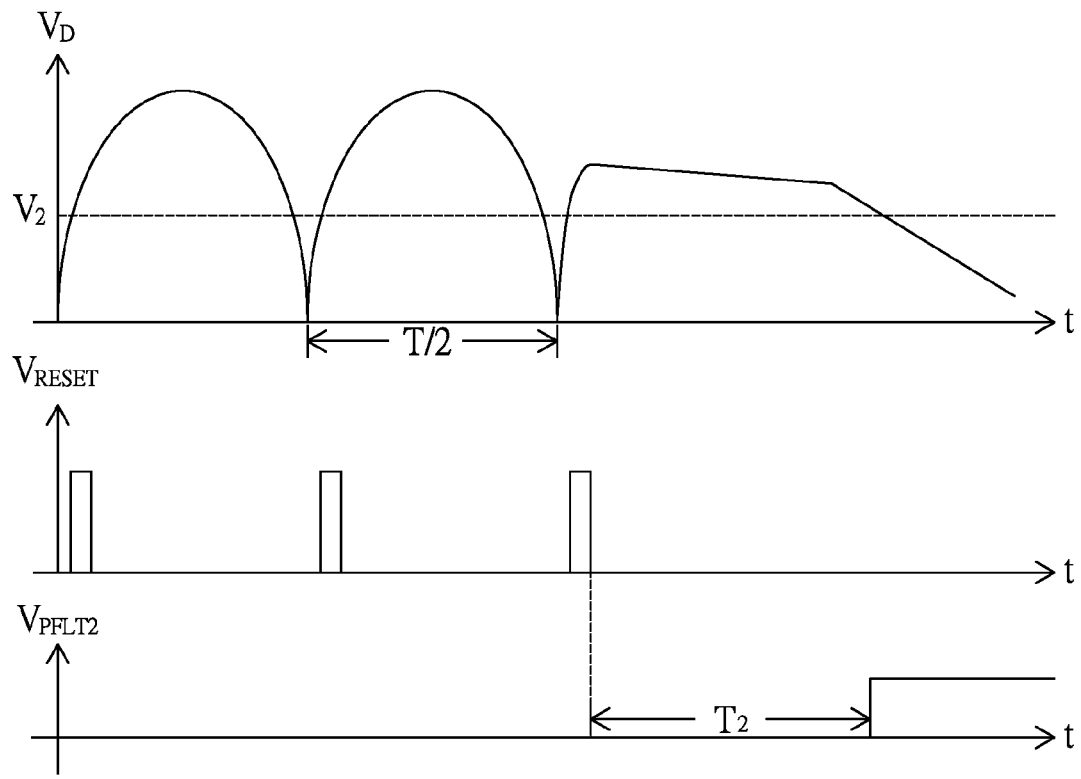
FIG. 6 illustrates corresponding waveforms of a detected signal $V_D$, a reset signal $V_{RESET}$, and a second power-fault signal $V_{PFLT2}$ of FIG. 5.

FIG. 6 illustrates corresponding waveforms of the detected signal $V_D$, the reset signal $V_{RESET}$, and the second power-fault signal $V_{PFLT2}$. As illustrated in FIG. 6, T/2 represents the half of a period of the AC power $V_{ac}$, $T_2$ represents the second time duration, and $T_2$ is longer than T/2.

The OR gate 2104 has a first input end coupled with the first power-fault signal $V_{PFLT1}$, a second input end coupled with the second power-fault signal $V_{PFLT2}$, and an output end providing a third power-fault signal $V_{PFLT3}$.

The driver 2105 generates a power-fault driving signal $V_{PFLTD}$ according to the third power-fault signal $V_{PFLT3}$, wherein the level—being high or low—of the power-fault driving signal $V_{PFLTD}$ follows that of the third power-fault signal $V_{PFLT3}$, and the power-fault driving signal $V_{PFLTD}$ has a stronger driving capacity than the third power-fault signal $V_{PFLT3}$.

The comparator 2106, the flip-flop 2107, the resistor 2108, the comparator 2109, the oscillator 2110, the AND gate 2111, the flip-flop 2112, and the driver 2113 are used for generating the gating signal $V_G$. As the generation of the gating signal $V_G$ is not a focus of the present invention, the principle thereof will not be addressed here.

The NMOS transistor 211 switches the power transmission circuit 202 in response to the gating signal $V_G$.

The resistor 212 generates the current sensing signal $V_{CS}$ according to a primary current $I_P$ flowing through a primary coil of the transformer when the NMOS transistor 211 is on.

The feedback circuit 213 generates the feedback signal $V_{FB}$ according to a difference of the DC output voltage $V_O$ and a reference voltage, the reference voltage being generated in the feedback circuit 213. When in operation, the DC output voltage $V_O$ will approach the reference voltage.

The photo coupler circuit 214 has an input terminal coupled with the power-fault driving signal $V_{PFLTD}$, and an output terminal providing the power-fault signal $V_{PFLT}$, wherein the power-fault signal $V_{PFLT}$ will be at a low level when the power-fault driving signal $V_{PFLTD}$ is at a high level, and be at a high level when the power-fault driving signal $V_{PFLTD}$ is at a low level.

The X capacitor 215 is used to suppress a differential interference accompanying the AC power $V_{ac}$.

When the AC power $V_{ac}$ is in a normal condition, both the first power-fault signal $V_{PFLT1}$ and the second power-fault signal $V_{PFLT2}$ will be inactive to make the third power-fault signal $V_{PFLT3}$ inactive, and the power-fault signal $V_{PFLT}$ will therefore be inactive (at a high level).

When a brownout of the AC power $V_{ac}$ occurs, the first power-fault signal $V_{PFLT1}$ will be active to make the third power-fault signal $V_{PFLT3}$ active, and the power-fault signal $V_{PFLT}$ will therefore be active (at a low level) to alarm the load 220 before the DC output voltage $V_O$ falls below a minimum operable level.

Figure 1:
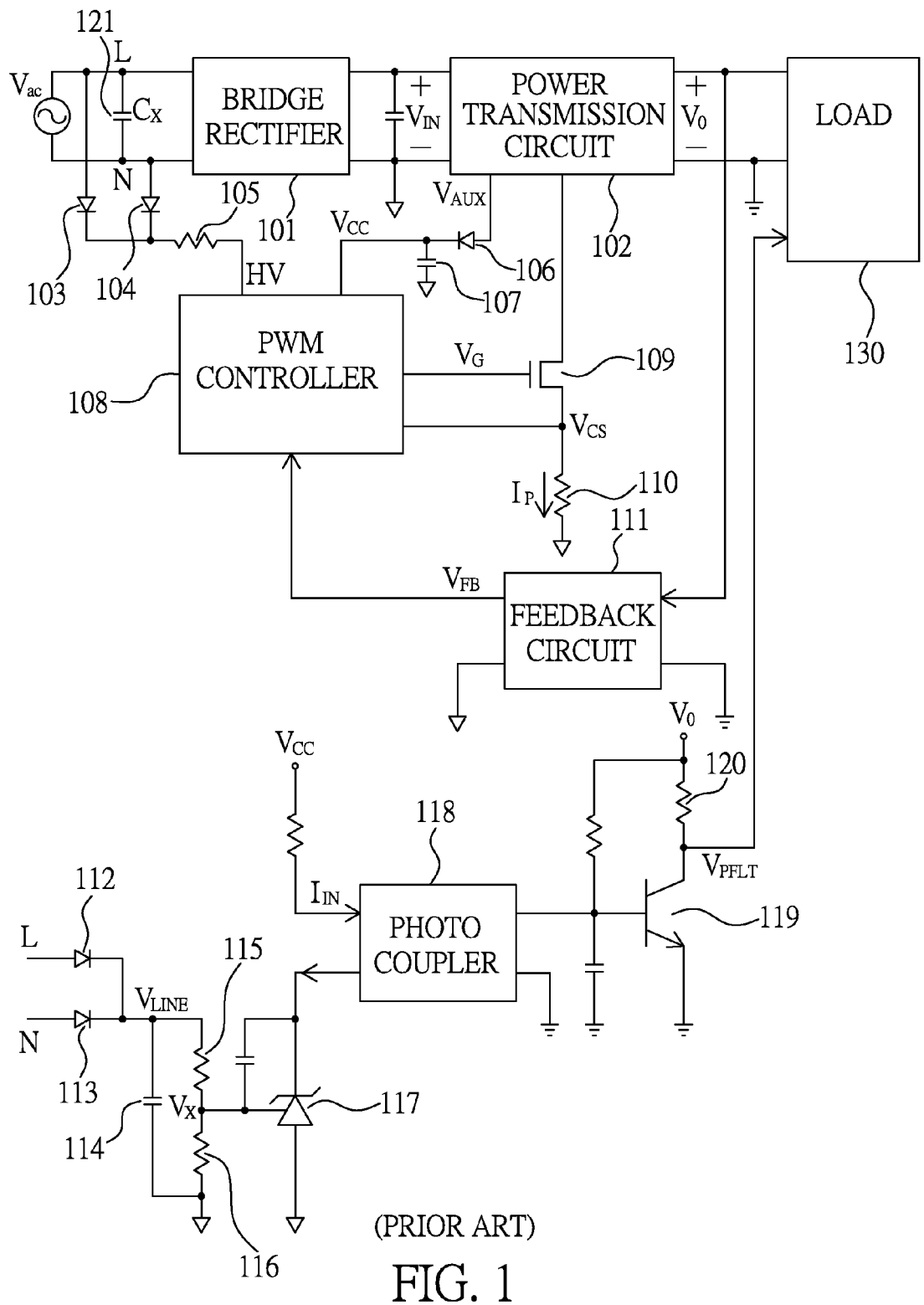
FIG. 1 illustrates a prior art power converter providing a power-fault signal.

When the AC power $V_{ac}$ is shut off, the second power-fault signal $V_{PFLT2}$ will be active to make the third power-fault signal $V_{PFLT3}$ active, and the power-fault signal $V_{PFLT}$ will therefore be active (at a low level) to alarm the load 220. It is to be noted that, in comparison with the prior art of FIG. 1, the present invention is capable of alarming the load in a short time after the AC power $V_{ac}$ is shut off, while the prior art of FIG. 1 cannot do that.

With the designs elaborated above, the present invention possesses the following advantages:

1. The controller of the present invention is capable of detecting input power and generating a protection signal for a power converter to alarm a television apparatus or a portable computer when a brownout of an AC power occurs.

2. The controller of the present invention is capable of detecting input power and generating a protection signal for a power converter to alarm a television apparatus or a portable computer shortly after an AC power gets shut off.

3. The controller of the present invention is capable of detecting input power using an existing start-up pin.

4. The controller of the present invention is capable of detecting input power and generating a protection signal for a power converter using as few additional components as possible.

While the invention has been described by way of examples and in terms of preferred embodiments, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

In summation of the above description, the present invention herein enhances the performance over the conventional structure and further complies with the patent application requirements and is submitted to the Patent and Trademark Office for review and granting of the commensurate patent rights.

What is claimed is:

1. A controller detecting input power and generating a protection signal for a power converter to alarm a load, comprising:
   a high voltage start-up pin for connecting with an output terminal of an external start-up circuit, wherein said external start-up circuit has two input terminals coupled to an AC power;
   a sample-and-hold circuit for periodically sampling a voltage signal at said high voltage start-up pin to generate a detected signal, wherein the detected signal has an envelope proportional to an envelope of a full-wave rectified voltage of the AC power;
   a brownout detector for generating a first power-fault signal according to said detected signal, wherein said first power-fault signal will be active when said detected signal is below a first threshold voltage for a first time duration, said first time duration being longer than half of a period of said AC power, wherein said brownout detector comprises a comparator having a positive input end, a negative input end, and an output end, said positive input end being coupled with a first threshold voltage, and said negative input end being coupled with said detected signal; and a counter having an input end coupled with said output end of said comparator, and an output end providing said first power-fault signal, wherein said counter will count up when said output end of said comparator is at a high level, and will be reset to an initial state when said output end of said comparator is at a low level, and said first power-fault signal will be active when said counter counts up to a first predetermined number, which is corresponding to said first time duration;
- an AC-off detector for generating a second power-fault signal according to said detected signal, wherein said second power-fault signal will be active when said detected signal is above a second threshold voltage for a second time duration, said second time duration being longer than half of said period of said AC power;
- an OR gate having a first input end coupled with said first power-fault signal, a second input end coupled with said second power-fault signal, and an output end providing a third power-fault signal; and
- a driver, which has an input end coupled with said third power-fault signal, and an output end providing a power-fault driving signal for driving an external photo coupler circuit to generate a power-fault signal.

2. The controller detecting input power and generating a protection signal as claim 1, wherein said AC-off detector comprises:
- a comparator having a negative input end, a positive input end, and an output end, said negative input end being coupled with a second threshold voltage, and said positive input end being coupled with said detected signal;
- a one shot unit having an input end coupled with said output end of said comparator, and an output end providing a reset signal; and
- a counter having an input end coupled with a clock signal, a reset end coupled with said reset signal, and an output end providing said second power-fault signal, wherein said counter will count up when said reset signal is at a low level, and will be reset to an initial state when said reset signal is at a high level, and said second power-fault signal will be active when said counter counts up to a second predetermined number, which is corresponding to said second time duration.

3. A controller detecting input power and generating a protection signal for a power converter to alarm a load, wherein said power converter converts an AC power to a DC output voltage for said load, the controller comprising:
- a high voltage start-up pin for connecting with an output terminal of an external start-up circuit, wherein said external start-up circuit has two input terminals coupled to said AC power;
- a sample-and-hold circuit for periodically sampling a voltage signal at said high voltage start-up pin to generate a detected signal, wherein the detected signal has an envelope proportional to an envelope of a full-wave rectified voltage of the AC power;
- a brownout detector for generating a first power-fault signal according to said detector signal, wherein said first power-fault signal will be active when said detected signal is below a first threshold voltage for a first time duration, said first time duration being longer than half of a period of said AC power;

wherein said brownout detector comprises: a comparator having a positive input end, a negative input end, and an output end, said positive input end being coupled with a first threshold voltage, and said negative input end being coupled with said detected signal; and a counter having an input end coupled with said output end of said comparator, and an output end providing said first power-fault signal, wherein said counter will count up when said output end of said comparator is at a high level, and will be reset to an initial state when said output end of said comparator is at a low level, and said first power-fault signal will be active when said counter counts up to a first predetermined number, which is corresponding to said first time duration;
- an AC-off detector for generating a second power-fault signal according to said detected signal, wherein said second power fault signal will be active when said detected signal is above a second threshold voltage for a second time duration, said second time duration being longer than half of said period of said AC power;
- an OR gate having a first input end coupled with said first power-fault signal, a second input end coupled with said second power-fault signal, and an output end providing a third power-fault signal for alarming said load;
- a driver, which has an input end coupled with said third power-fault signal, and output end providing a power-fault driving signal for driving an external photo coupler circuit to generate a power-fault signal.

4. The controller detecting input power and generating a protection signal as claim 3, wherein said AC-off detector comprises:
- a comparator having a negative input end, a positive input end, and an output end, said negative input end being coupled with a second threshold voltage, and said positive input end being coupled with said detected signal;
- a one shot unit having an input end coupled with said output end of said comparator, and an output end providing a reset signal; and
- a counter having an input end coupled with a clock signal, a reset end coupled with said reset signal, and an output end providing said second power-fault signal, wherein said counter will count up when said reset signal is at a low level, and will be reset to an initial state when said reset signal is at a high level, and said second power-fault signal will be active when said counter counts up to a second predetermined number, which is corresponding to said second time duration.

5. A controller detecting input power and generating a protection signal for a power converter to alarm a load, wherein said power converter converts an AC power to a DC output voltage for a load, the controller comprising:
- a high voltage start-up pin for connecting with an output terminal of an external start-up circuit, wherein said external start-up circuit has two input terminals coupled to said AC power;
- a sample-and-hold circuit for periodically sampling a voltage signal at said high voltage start-up pin to generate a detected signal, wherein the detected signal has an envelope proportional to an envelope of a full-wave rectified voltage of the AC power;
- a brownout detector for generating a first power-fault signal according to said detected signal, wherein said first power-fault signal will be active when said detected signal is below a first threshold voltage for a first time duration, said first time duration being longer than half of a period of said AC power;

an AC-off detector for generating a second power-fault signal according to said detected signal, wherein said second power-fault signal will be active when said detected signal is above a second threshold voltage for a second time duration, said second time duration being longer than half of said period of said AC power; and an OR gate having a first input end coupled with said first power-fault signal, a second input end coupled with said second power-fault signal, and an output end providing a third power-fault signal for alarming said load;

wherein said brownout detector comprises:

a comparator having a positive input end, a negative input end, and an output end, said positive input end being coupled with a first threshold voltage, and said negative input end being coupled with said detected signal; and a counter having an input end coupled with said output end of said comparator, and an output end providing said first power-fault signal, wherein said counter will count up when said output end of said comparator is at a high level, and will be reset to an initial state when said output end of said comparator is at a low level, and said first power-fault signal will be active when said counter counts up to a first predetermined number, which is corresponding to said first time duration; and wherein said AC-off detector comprises:

a comparator having a negative input end, a positive input end, and an output end, said negative input end being coupled with a second threshold voltage, and said positive input end being coupled with said detected signal;

a one shot unit having an input end coupled with said output end of said comparator, and an output end providing a reset signal; and a counter having an input end coupled with a clock signal, a reset end coupled with said reset signal, and an output end providing said second power-fault signal, wherein said counter will count up when said reset signal is at a low level, and will be reset to an initial state when said reset signal is at a high level, and said second power-fault signal will be active when said counter counts up to a second predetermined number, which is corresponding to said second time duration.

6. The controller detecting input power and generating a protection signal as claim 5, further comprising a driver, which has an input end coupled with said third power-fault signal, and an output end providing a power-fault driving signal for driving an external photo coupler circuit to generate a power-fault signal.

* * * * *